United States Patent [19]
Au-Yang

[11] 3,906,334
[45] Sept. 16, 1975

[54] THYRISTOR LATCHING SWITCH

[76] Inventor: William M. Au-Yang, 6762 Los Verdes Dr., Los Angeles, Calif. 90274

[22] Filed: Nov. 24, 1972

[21] Appl. No.: 309,605

[52] U.S. Cl. ............... 323/21; 307/252 B; 307/311; 250/205; 323/24; 323/36; 323/39
[51] Int. Cl.² ........................ G05F 1/44; H03K 3/42
[58] Field of Search .......................... 323/21, 34–38, 323/39; 307/311, 252 B, 252 T; 250/205, 250/213 A; 315/157, 158, 159

[56] References Cited

UNITED STATES PATENTS 3,213,441 10/1965 Shook ............................ 250/213 A
3,418,480 12/1968 Miller .................................. 323/21

OTHER PUBLICATIONS

IBM Tech. Disc. Bull. Vol. 14, No. 2, July 1971 p. 393; Author: Beistlie.

*Primary Examiner*—Gerald Goldberg

[57] ABSTRACT

A thyristor connected in series with a load impedance is latched into its conductive state by a light sensitive voltage divider which is illuminated by a lamp connected between the voltage divider and the gate lead of the thyristor. Illumination of the light sensitive element of the voltage divider by the lamp maintains the output of the voltage divider at a level which keeps the lamp illuminated and the thyristor firing continuously. Embodiments which cause the light sensitive voltage divider to be illuminated by an auxiliary lamp to initially cause the circuit to actuate are presented.

6 Claims, 2 Drawing Figures

THYRISTO LATCHING SWITCH

BACKGROUND OF THE INVENTION

1. Field of the Invention

This invention relates to thyristor controlled power circuits and more particularly to a latching circuit for a thyristor employing light sensitive means with light feedback to maintain the circuit in an on condition.

2. Prior Art

The prior art contains many circuits suitable for latching thyristors in the on mode even though the initial stimulus which caused the thyristor to conduct has been removed. Even circuits employing light feedback have been proposed, see e.g. U.S. Pat. No. 3,467,828. Typically the circuits are relatively complicated and the circuits which use light feedback keep power on the feedback lamp during a large portion of the power cycle with consequent reduction in life of this component.

The circuit of this invention is simple and applies power to the feedback lamp only momentarily during each half cycle and therefore increases its life significantly. If a threshold type lamp is used, the same lamp doubles as the trigger for the thyristor i.e. same power every time independent of varying grid characteristics of the thyriwtor, thus saving the cost of an extra trigger device.

SUMMARY OF THE INVENTION

The circuit of this invention uses a lamp in series with the gate lead of a thyristor as a source of feedback light to maintain a photoresistive photocell in a condition of low impedance. The photocell together with a fixed impedance forms a light sensitive voltage divider network connected across the power terminals of a thyristor, and the output of the voltage divider furnishes the gate signal for the thyristor. When the photocell is unilluminated the voltage applied to the thyristor gate is insufficient to cause triggering, but when the photocell is illuminated, triggering will occur. Thyristor triggering voltage, derived from the voltage divider, causes a lamp, preferably a threshold type lamp, in series with the gate lead to light and to further illuminate the photocell so as to maintain triggering voltage on the thyristor, thereby latching the thyristor in a conductive mode.

Initial illumination of the photocell which causes the first triggering action may be accomplished, in accordance with one embodiment of the invention, by means of an auxiliary lamp, which preferably is a threshold type lamp, connected to a second light sensitive circuit across the power terminals of the thyristor in such manner that illumination of the sensitive element of the second circuit causes the auxiliary lamp to light. The auxiliary lamp, the feedback lamp and the photocell in the gate circuit voltage divider are all housed in a light-proof box so that light from either lamp will cause triggering voltage to appear at the output of the voltage divider.

DESCRIPTION OF THE PRESENTLY PREFERRED EMBODIMENT

Figure 1:
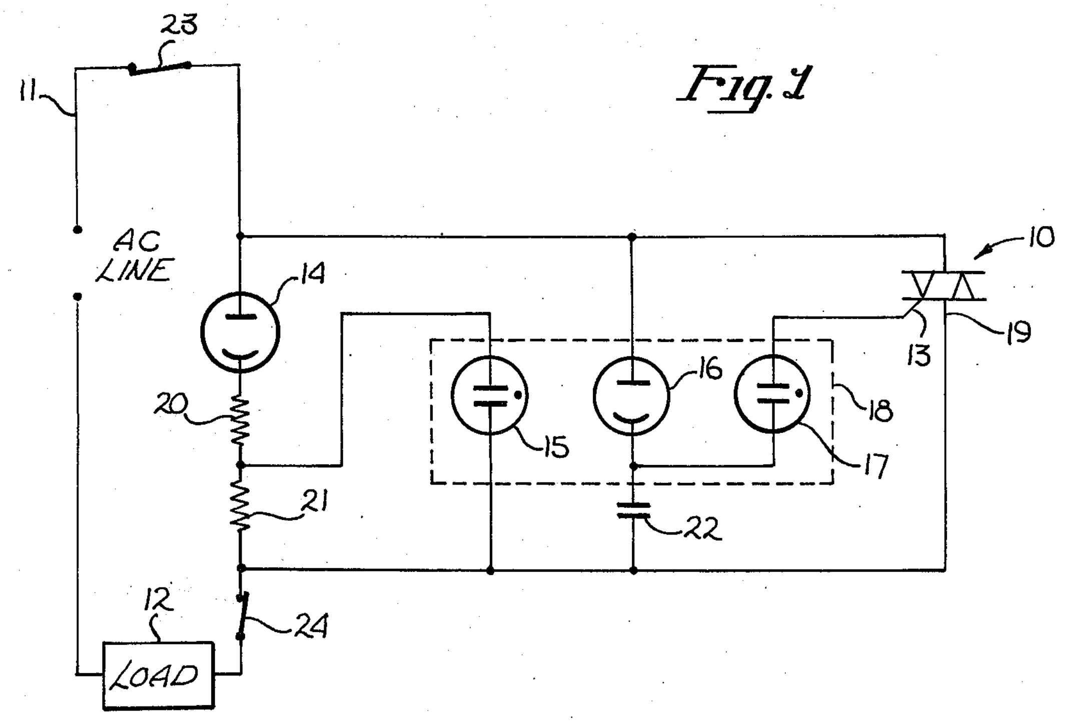
FIG. 1 is a schematic diagram of a preferred embodiment of the present invention which includes actuating means which actuates when the light level increases above a predetermined minimum level.

Referring now the drawing and to FIG. 1 in particular where the latching circuit of the present invention is shown in a presently preferred embodiment in the form of a light actuated latching switch.

The load 12 in series with triac 10 is shown connected across the AC line 11 so that the voltage appearing across the load is dependent upon the condition of triac 10. If the triac is conducting at any particular instant, substantially full line voltage will be applied to the load, whereas if the triac is not conducting very little voltage will be applied to the load.

The conduction of triac 10 is controlled by gate 13. Sufficient current flow between base 19 and gate 13 will cause the triac to be triggered into conduction. Illumination of photocell 14 will cause triggering voltage to appear between base 19 and gate 13 as follows:

Photocell 14 is of the photoconductive type, that is it has a high impedance when dark and a relatively low impedance when illuminated. The resistors 20 and 21 are selected such that when little light is present, the voltage drop across resistor 21 is too low to cause firing of neon lamp 15. While the present invention is described using neon lamps as the sources of light, it will be clear to those skilled in the art that other types of lamps could be used to provide the light which affect the impedance of the photocells. At a predetermined level of illumination, photocell 14 drops in impedance enough to cause neon lamp 15 to fire. Neon lamp 15 is in a light-proof box, as indicated by numeral 18, with photocell 16 and neon lamp 17. The firing of neon lamp 15 causes photocell 16, which is also of the photconductive type, to be illuminated and thus to drop in impedance. The drop in impedance of photocell 16 is enough to cause the voltage across capacitor 22 to rise to the level which causes current to flow in the lead to gate 13. The triggering of triac 10 results in full line voltage being applied to the load 12, and hence no power is applied to lamps 15 and 17.

In order to achieve these results, the rise time constant and sensitivity of photocell 16 must be such that it will drop in impedance sufficiently due to its illumination by neon lamp 15 to cause neon lamp 17 to fire.

Once triggered, triac 10 will remain conductive until the end of the half cycle of line voltage during which it is triggered. Unless retriggered on the next half cycle, the triac will return to its non-conductive state. So long as photocell 14 is illuminated, triac 10 could be triggered on each half cycle of line voltage as described above.

If the illumination on photocell 14 is removed, however, other means than neon lamp 15 must be provided to reduce the impedance of photocell 16 so as to trigger triac 10 on each half cycle. The characteristics of photocell 16 are such that its decay time constant is long with respect to one half cycle of line voltage so that its impedance does not change drastically in one half cycle. The sensitivity of photocell 16 is high enough so that the momentary illumination by neon lamp 17 on each half cycle is sufficient to keep its impedance low to insure triggering of triac 10 on the next half cycle.

Once triggered by illumination of photocell 14, therefore, the circuit "latches" and voltage will continue to be applied to load 12 on each succeeding half cycle until turned off by external means.

Most neon lamps have a relatively short life, in the order of 5,000 hours. In this circuit, the neon lamps 15 and 17 are on only momentarily on each half cycle since the voltage across the triac drops to about one volt when the triac fires, and therefore lamp life in this circuit is extremely long.

The switch can be turned off by interrupting the power at any point in the power circuit. Normally closed momentary switches 23 and 24 are shown in the circuit to illustrate that interruption either at the power source or at the load will release the latch and allow the circuit to return to its quiescent state assuming that photocell 14 is no longer illuminated.

If either switch 23 or 24 is opened for a period which is long compared to the decay time constant of photocell 16, the impedance of photocell 16 will increase to the point that neon lamp 17 will no longer fire on each half cycle and triac 10 will not be triggered. Full line voltage will then appear across the triac and essentially no voltage will appear across load 12.

Most thyristors require a threshold device in the gate circuit in order to have stable operation. Therefore, an extra device (e.g. a trigger diode) would ordinarily be needed between gate 13 and lamp 17. However, if lamp 17 is a threshold type lamp, e.g. a gas discharge lamp, then no other threshold device is needed. That is, the lamp acts both as a light source and as a threshold device for the thyristor. This is a saving of one component.

Figure 2:
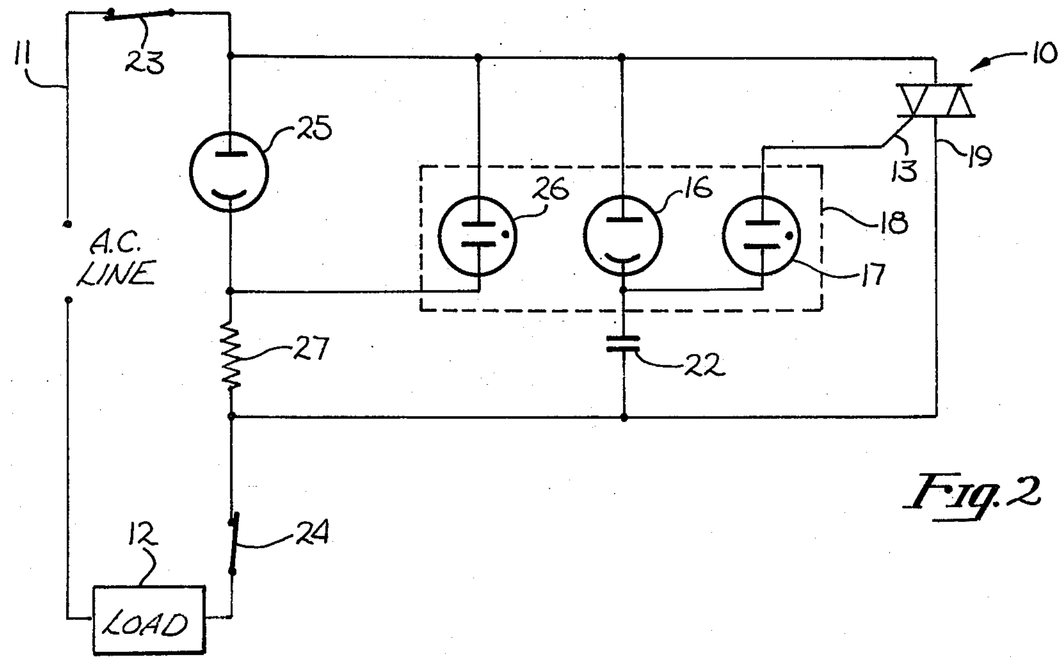
FIG. 2 is a schematic diagram of a second preferred embodiment of the present invention which is actuated as the light level decreases below a predetermined level.

FIG. 2 shows a modification of the circuit of FIG. 1 which is sensitive to a decreasing light level instead of an increasing light level as is the circuit of FIG. 1.

In FIG. 2, the network comprised of photocell 25, neon lamp 26 and resistor 27 replaces the network in FIG. 1 comprised of photocell 14, neon lamp 15 and resistors 20 and 21. When photocell 25 is illuminated it has a low impedance and therefore little voltage is dropped across it, almost the full line voltage being across resistor 27. As the illumination decreases, the impedance of photocell 25 increases until at some predetermined level of illumination the voltage across photocell 25 is sufficient to fire neon lamp 26. Lamp 26 is within the light tight box 18 with neon lamp 17 and photocell 16 and its light causes the impedance of photocell 16 to drop and thus fire neon lamp 17 and triac 10 as described above. The latching effect of lamp 17 and photocell 16 is also the same as described for the embodiment of FIG. 1.

A typical example of a latching switch in accordance with the embodiment of FIG. 1 could be constructed using the following component values:

| | |
|---|---|
| Triac 10 | 2N6071 |
| Photocell 14 | VT104 |
| Photocell 16 | VT102L |

| | |
|---|---|
| Lamp 15 | NE-2 |
| Lamp 17 | NE-2 . |
| Resistor 20 | 50K ohm |
| Resistor 21 | 100 K ohm |
| Capacitor 22 | 0.05 mfd |

Such an embodiment would be useful to serve a load of 400 watts from a 115V 60 HZ line.

It will be clear to those skilled in the art that means of activating the lathing circuit other than those described can be used for other applications. For example, a capacitive voltage divider can be used in place of photocell 14 and resistors 20 and 21, and arranged to be sensitive enough to fire neon lamp 15 when a person's finger approaches one of the leads and thus the latching switch will be sensitive to proximity. This and other actuation methods for the circuit of this invention are old and will readily occur to those skilled in the art. While the circuit has been described in connection with particular preferred embodiments utilizing triacs as the switching element, it is to be understood that other thyristors, either undirectional or bidirectional in nature could also be used within the spirit of this invention. Lamps other than the neon lamps described could also be used.

I claim:

1. An AC circuit control element comprising:

a. a thyristor;

b. a light sensitive voltage divider across the power terminals of said thyristor; and, c. a first lamp connected between said voltage divider and the gate lead of said thyristor, said first lamp being arranged to illuminate the light sensitive element of said voltage divider, whereby when the light sensitive element of said voltage divider is illuminated, the output of said voltage divider will cause said first lamp to emit light so as to maintain illumination on said light sensitive element, the output from said voltage divider also causing said thyristor to trigger.

2. An AC circuit control element as recited in claim 1 wherein said first lamp is a threshold type lamp.

3. An AC circuit control element as recited in claim 2 wherein said first lamp is a neon lamp.

4. An AC circuit control element as recited in claim 1 and further including a second lamp, said second lamp being arranged to illuminate the light sensitive element of said voltage divider whereby illumination of said second lamp will cause said voltage divider to trigger said thyristor.

5. An AC circuit control element as recited in claim 3 and further including light sensitive means for energizing said second lamp.

6. An AC circuit control element as recited in claim 5 wherein said light sensitive means comprises a second light sensitive voltage divider connected across the power terminals of said thyristor.

* * * * *